US008264855B2

(12) United States Patent
Ma et al.

(10) Patent No.: US 8,264,855 B2
(45) Date of Patent: Sep. 11, 2012

(54) ELECTRONIC DEVICE WITH A LOCKING ASSEMBLY

(75) Inventors: Liang-Chun Ma, Tu-Cheng (TW); Ming-Chien Chiu, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 32 days.

(21) Appl. No.: 13/028,155

(22) Filed: Feb. 15, 2011

(65) Prior Publication Data

US 2011/0242785 A1 Oct. 6, 2011

(30) Foreign Application Priority Data

Mar. 30, 2010 (CN) .................... 2010 2 0145038 U

(51) Int. Cl.
*H05K 7/14* (2006.01)
(52) U.S. Cl. ....................................................... 361/801
(58) Field of Classification Search .................. 361/801, 361/679.02, 802, 807, 810, 823, 825; 174/520
See application file for complete search history.

(56) References Cited

U.S. PATENT DOCUMENTS

| 6,293,636 | B1 * | 9/2001 | Le et al. ...................... 312/223.2 |
| 7,375,960 | B2 * | 5/2008 | Blaalid et al. ............. 361/679.33 |
| 2011/0115347 | A1 * | 5/2011 | Xu et al. ..................... 312/223.1 |

* cited by examiner

*Primary Examiner* — Jeremy Norris
*Assistant Examiner* — Tremesha S Willis
(74) *Attorney, Agent, or Firm* — Altis Law Group, Inc.

(57) ABSTRACT

An electronic device includes an enclosure and a locking assembly. The enclosure defines an accommodating hole and includes a bottom wall defining a pair of receiving portions. Centers of the pair of receiving portions define an imaginary line. The accommodating hole is configured on a perpendicular bisector of the imaginary line. The locking assembly includes a guiding part, a pair of sliding portions, and a control portion. The guiding part and the bottom wall cooperatively define a receiving space receiving the sliding portions. Each of the sliding portions includes a securing portion, a blocking portion and a groove closing to the blocking portion. One end of the control portion passes through the accommodating hole, and the other end is received in the receiving space. The control portion defines a pair of guiding grooves symmetrical about and inclined to the perpendicular bisector and used to engage with the securing portions.

13 Claims, 6 Drawing Sheets

ELECTRONIC DEVICE WITH A LOCKING ASSEMBLY

BACKGROUND

1. Technical Field

The present disclosure relates to electronic devices, and more particularly to a locking assembly of an electronic device.

2. Description of Related Art

Many electronic devices, such as IP phones, or LCD TVs, are mounted on walls by use of bolts or other fasteners. Generally, these electronic devices are configured with a groove to receive the bolts or fasteners. However, the electronic devices are not always configured with a structure to lock or secure the electronic device to the fastener. The lack of such structure can lead to potential disengagement of the electronic device from the fastener, and correspondingly result in damage to the electronic device.

Therefore, there is room for improvement within the art.

DETAILED DESCRIPTION

Figure 1:
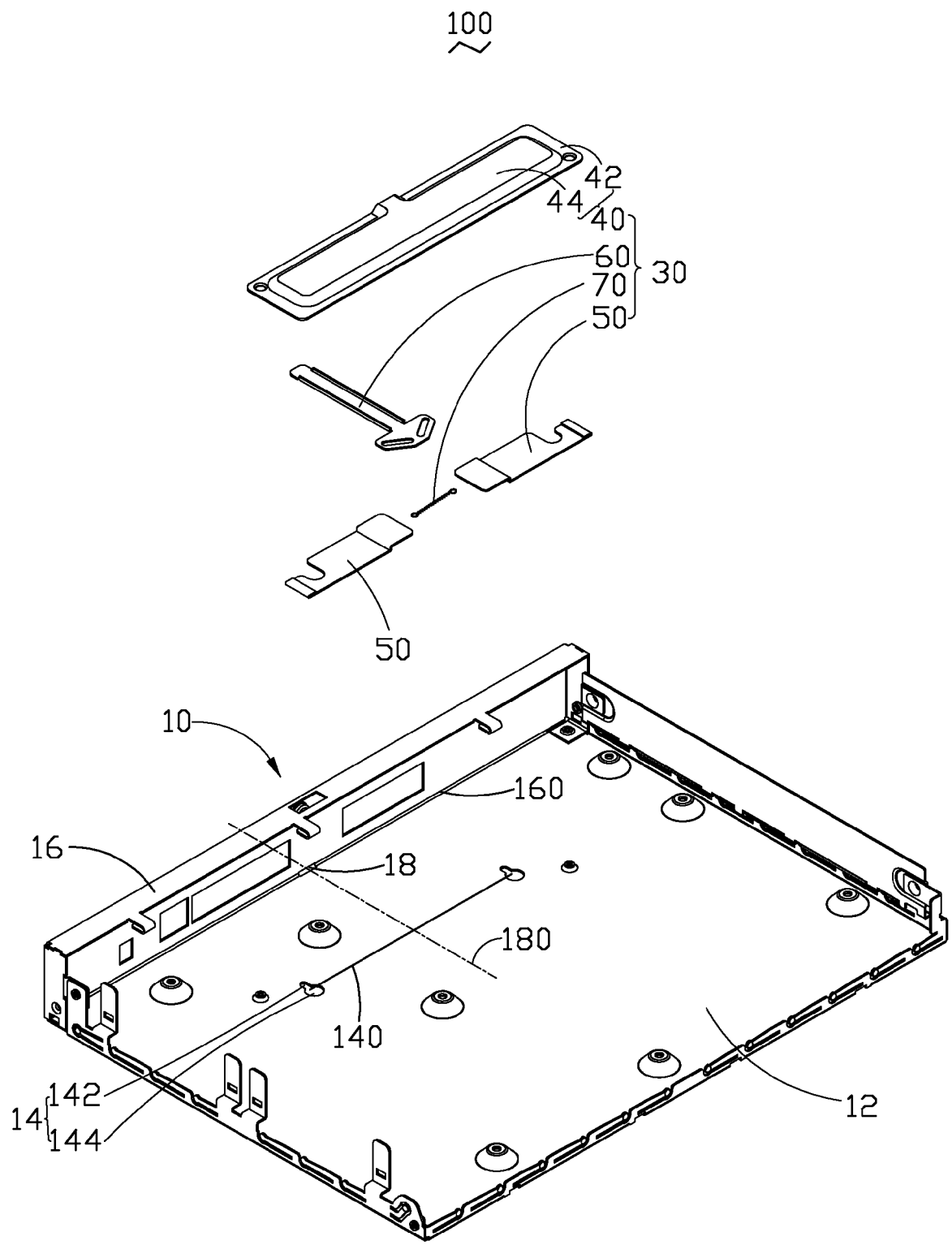
FIG. 1 is an exploded, isometric view of an electronic device of an exemplary embodiment of the disclosure.

Referring to FIG. 1, a portion of an electronic device 100 of an exemplary embodiment of the present disclosure is illustrated. The electronic device 100 includes an enclosure 10 and a locking assembly 30. The electronic device 100 may be but not limited to a phone, a router, a switch, or an LCD TV, for example.

Figure 6:
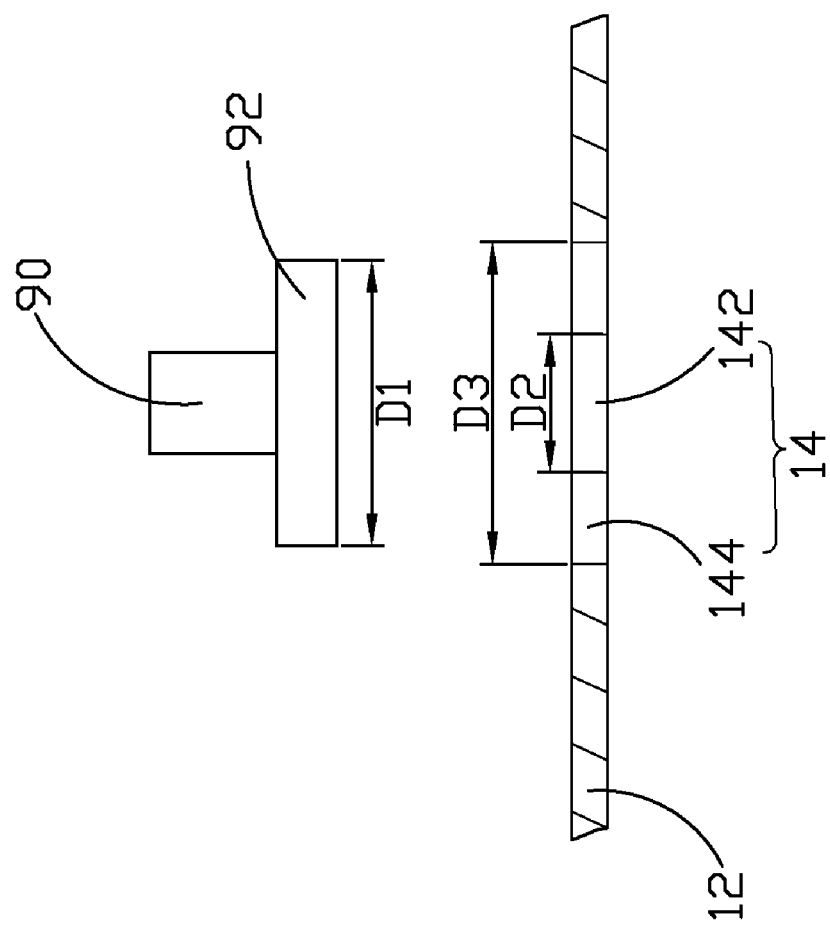
FIG. 6 is a schematic, exploded view of part of an enclosure with a receiving portion and a fastener.

The enclosure 10 accommodates electronic components, such as printed circuit boards (PCBs) and/or hard disc drives (HDDs). Although the illustrated embodiment shows the enclosure 10 being substantially rectangular, other configurations, shapes, or structures may be utilized. In this exemplary embodiment, the enclosure 10 includes a bottom wall 12 and a plurality of sidewalls 16 (two sidewalls shown). The bottom wall 12 defines a pair of receiving portions 14. In this exemplary embodiment, the receiving portion 14 includes a first receiving hole 142 and a second receiving hole 144 in communication with the first receiving hole 142. Referring to FIG. 6, the diameter D1 of a head 92 of a fastener 90 is greater than the width D2 of the first receiving hole 142, and is less than the width D3 of the second receiving hole 144.

An imaginary line 140 is defined between the centers of each of the two receiving portions 14. One of the sidewalls 16 is parallel with the imaginary line 140 and defines an accommodating hole 18. The accommodating hole 18 is configured on the perpendicular bisector 180 of the imaginary line 140. In this exemplary embodiment, the accommodating hole 18 is defined in a common border 160 of the sidewall 16 and the bottom wall 12.

Figure 2:
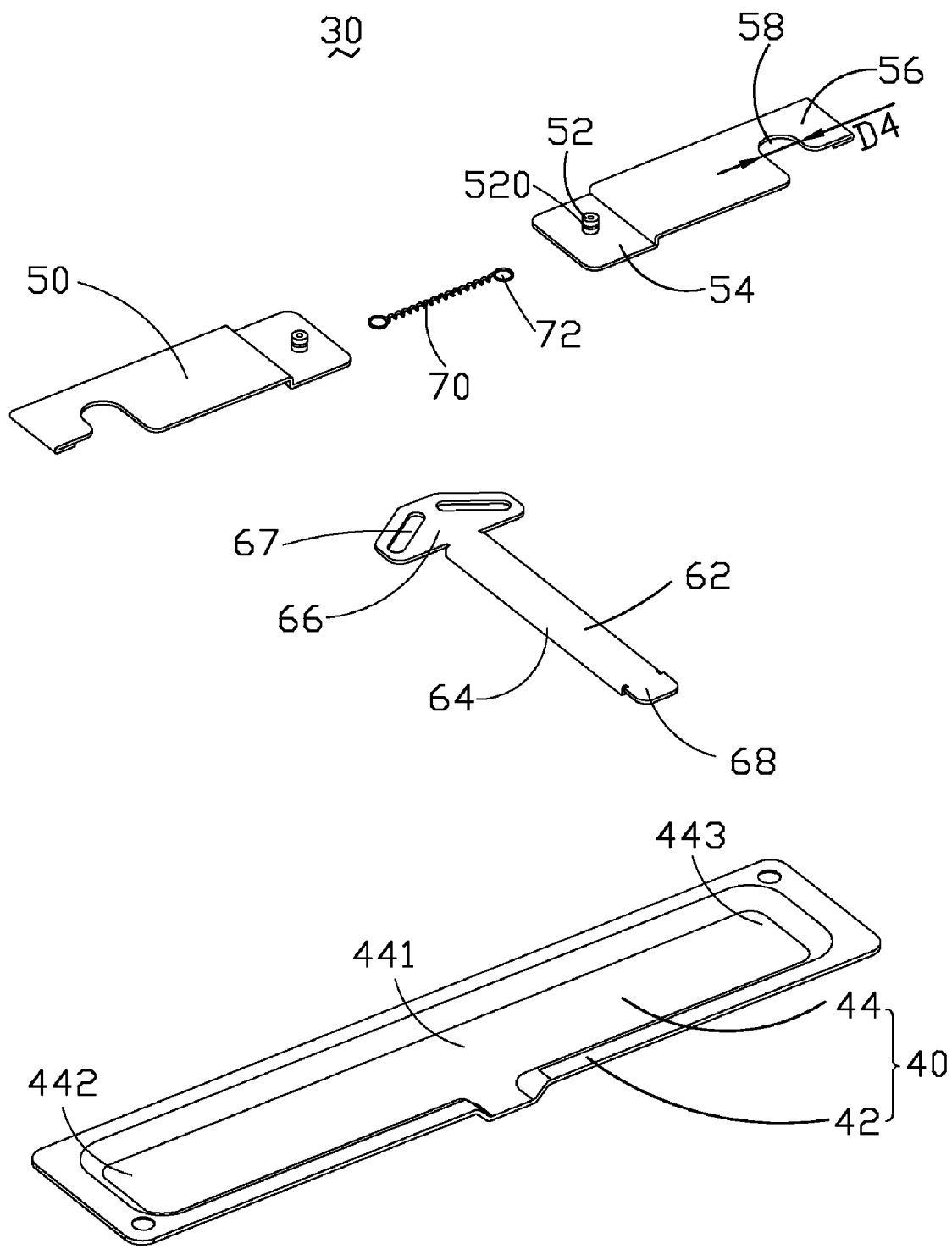
FIG. 2 is an exploded, isometric view of a locking assembly of the electronic device of FIG. 1.

The locking assembly 30 is attached to the bottom wall 12 of the enclosure 10 and used to prevent the enclosure 10 from disengaging from the fastener 90. Referring to FIG. 2, the locking assembly 30 includes a guiding part 40, a pair of sliding portions 50, a control portion 60, and a resilient member 70.

Figure 3:
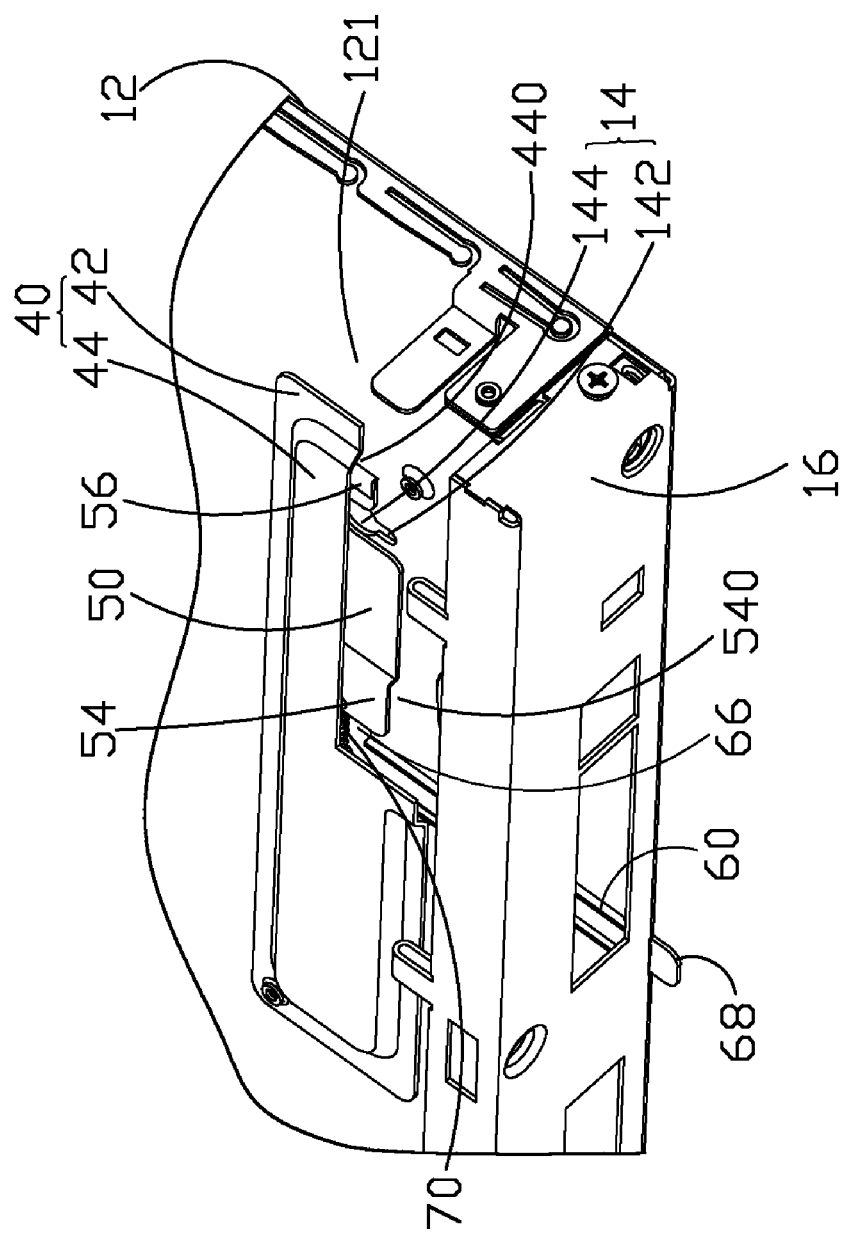
FIG. 3 is a part of an assembled view of FIG. 1 with a portion of a guiding part being shown in cutaway.

The guiding part 40 includes a main body 42 attached to an inner surface 121 of the bottom wall 12, and a receiving portion 44 projecting from the main body 42. The receiving portion 44 and the inner surface 121 collectively define a receiving space 440, as shown in FIG. 3, to receive the pair of sliding portions 50, the resilient member 70 and part of the control portion 60. In this exemplary embodiment, the receiving portion 44 is substantially T-shaped. The two receiving portions 14 are on opposite sides of the receiving portion 44 and each receiving portion 14 is adjacent to one of two opposite edges 442, 443 of the receiving portion 44. That is, one of the receiving portions 14 is adjacent to an edge 442 of the receiving portion 44, and the other one of the receiving portions 14 is adjacent to the other edge 443 of the receiving portion 44. Thus, the first receiving holes 142 and the second receiving holes 144 communicate the receiving space 440.

The pair of sliding portions 50 are both received in the receiving space 440, and can snugly move along the imaginary line 140 toward or away from each other, and relative to the bottom wall 12 of the enclosure 10. Each of the sliding portions 50 comprises a securing portion 52 and a blocking portion 56. The securing portion 52 and the blocking portion 56 are located at opposite ends of each sliding portion 50. The securing portions 52 are adjacent to a middle part 441 of the guiding part 40. Each blocking portion 56 is adjacent to one of the two receiving portions 14. Each sliding portion 50 defines a groove 58 adjacent to its blocking portion 56. In a locked position, shown in FIG. 4, the blocking portions 56 block the second receiving holes 144. In an unlocked position, shown in FIG. 5, the grooves 58 are superposed over the second receiving holes 144 of the receiving portions 14. The width D4 of each of the grooves 58 is greater than or equal to the width D3 of the corresponding second receiving hole 144, thereby the head 92 of the fastener 92 may pass through the corresponding groove 58.

The securing portions 52 are used to engage the resilient member 70 and the control portion 60. In this exemplary embodiment, the securing portions 52 are columnar, each defining a locking recess 520 circling the outer surface of the securing portion 52. The resilient member 70 comprises a pair of locking ends 72, each of which engaging with one of the corresponding securing portions 52 to secure the resilient member 70 between the sliding portions 50. Each locking end 72 is ring-shaped to be placed around one of the securing portions 52 and positioned in the locking recesses 520. In this exemplary embodiment, each sliding portion 50 comprises a securing plate 54, on which a corresponding securing portion 52 protrudes. In assembly, the securing plates 54 and the inner surface 121 collectively define a receiving gap 540, shown in FIG. 3. The securing portions 52 extend from the securing plates 54 toward to the inner surface 121. The resilient member 70 and part of the control portion 60 are received in the receiving gap 540.

One end of the control portion 60 passes through the accommodating hole 18 and the other end of the control portion 60 is received in the receiving space 440. The control portion 60 may be moved along the perpendicular bisector 180 relative to the bottom wall 12 of the enclosure 10. The control portion 60 comprises a base portion 62, a pair of limiting portions 64, an engaging portion 66 and an operating portion 68. The base portion 62 is connected between the engaging portion 66 and the operating portion 68. The engaging portion 66 is received in the receiving space 440 and connected between the pair of sliding portions 50. The operating portion 68 passes through the accommodating hole 18 of the enclosure 10 for exposure to user operation. When the user moves operating portion 68 along the perpendicular bisector 180, the engaging portion 66 moves along the perpendicular bisector 180 in the receiving space 440. The pair of limiting portions 64 project from the base portion 62 and may be formed by bending of two side edges of the base portion 62 to limit the direction of movement of the base portion 62 within the accommodating hole 18.

The engaging portion 66 defines a pair of guiding grooves 67 used to engage with the securing portions 52 of the pair of sliding portions 50. The pair of guiding grooves 67 are symmetrical about and inclined to the perpendicular bisector 180. The pair of guiding grooves 67 are configured to be co-formed to have a substantially V-shaped configuration. The opening of the V-shaped configuration faces towards the base portion 62.

Figure 4:
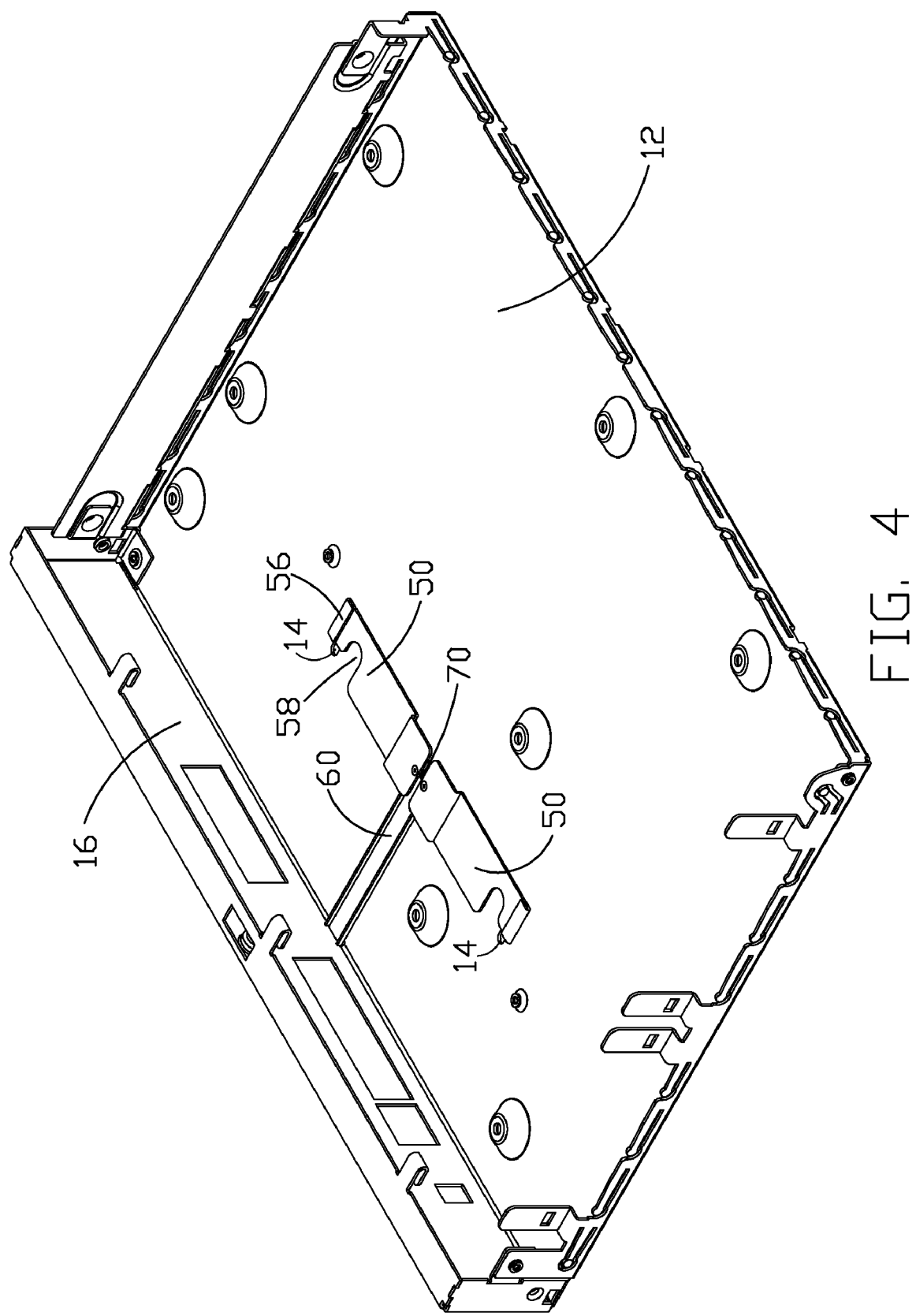
FIG. 4 is a partially assembled view of FIG. 1, showing the electronic device in a locked position.
Figure 5:
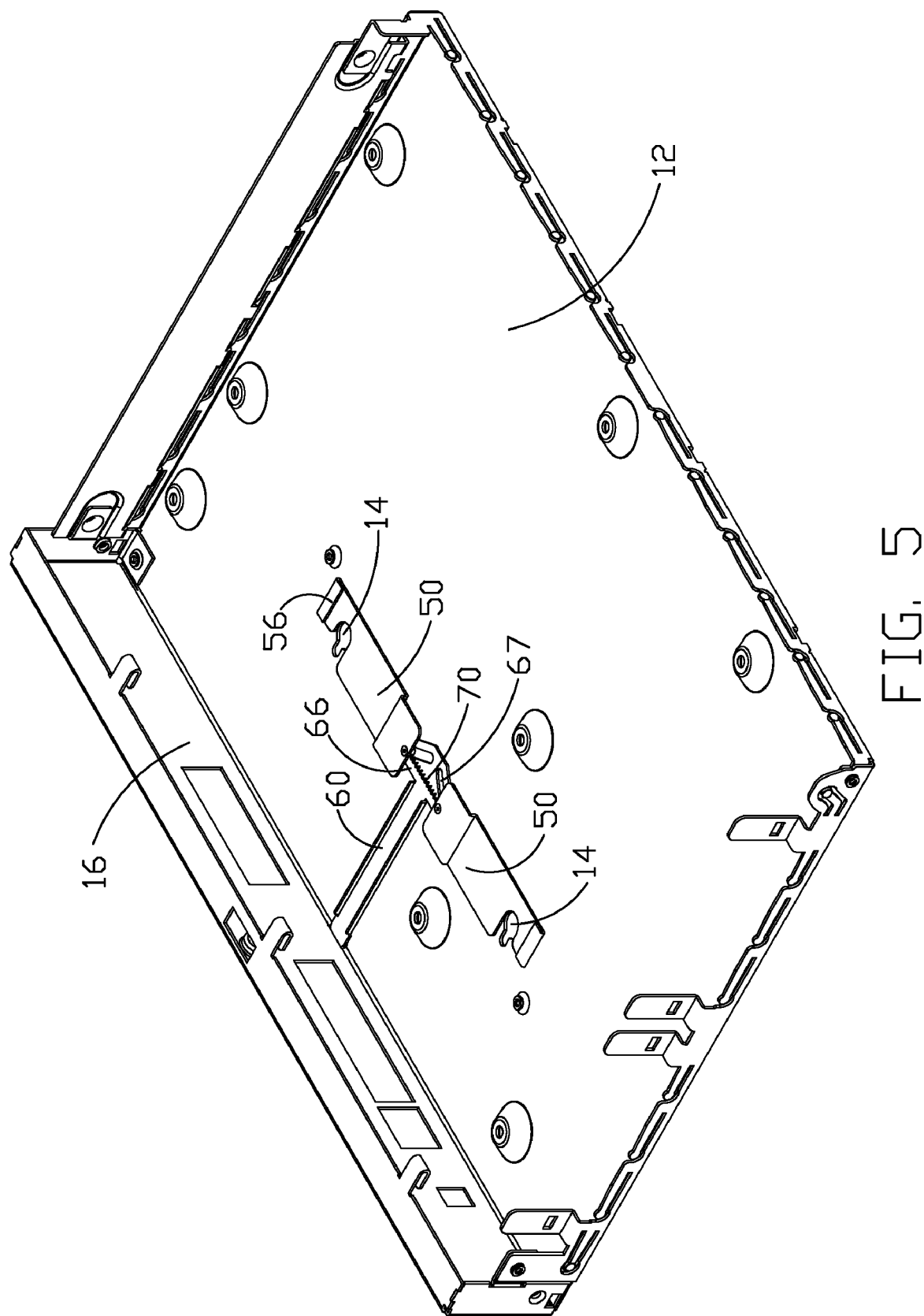
FIG. 5 is similar to FIG. 4, but showing the electronic device in an unlocked position.

Referring to FIGS. 3-5, in assembly, the pair of locking ends 72 of the resilient member 70 are respectively fixed to the securing portion 52 of the sliding portions 50. The securing portions 52 respectively pass through the pair of guiding grooves 67 and the operating portion 68 passes through the accommodating hole 18 of the enclosure 10, to position the control portion 60 between the sliding portions 50 and the enclosure 10. In this position, the resilient member 70 and the engaging portion 66 are positioned between the securing plate 54 and the inner surface 121, and received in the receiving gap 540. The guiding part 40 is installed to the inner surface 121 of the bottom wall 12 to form the receiving space 440 to receive the pair of sliding portions 50, the resilient member 70 and the engaging portion 66. Due to the relative positioning of the accommodating hole 18 and the guiding part 40, the control portion 60 may only move along the perpendicular bisector 180. Thus, the locking assembly 30 is suitably mounted on the enclosure 10.

Movements of the control portion 60 relative to the enclosure 10 along the perpendicular bisector 180 cause the blocking portions 56 of the pair of sliding portions 50 to move for covering or uncovering the pair of receiving portions 14, thereby the electronic device 100 being disposed between a locked and an unlocked position.

Referring to FIG. 4, in the locked position, no external force is put on the operating portion 68, and the securing portion 52 of the pair of sliding portions 50 are positioned to be close to each other under the resilient force of the resilient member 70 in the receiving space 440, with the blocking portions 56 covering the second receiving holes 144 respectively. In this situation, the head 92 of the fasteners 90 cannot move between the first receiving holes 142 and the second receiving holes 144 and the electronic device 100 is secured to the fastener 200, avoiding damage or loss associated with accidental disengagement.

Referring to FIG. 5, in the unlocked position, when the electronic device 100 is to be removed from the fasteners 90, an external force is put on the operating portion 68, and the control portion 60 moves along the perpendicular bisector 180. The engaging portion 66 moves away from the accommodating hole 18, thus, the securing portions 52 respectively move away from each other in the guiding grooves 67 to drive the blocking portions 56 move away from the second receiving holes 144, that is, the blocking portions 56 uncover the second receiving holes 144. Therefore, electronic device 100 can be removed from or fixed to the fasteners 90. In this position, the resilient member 70 is expanded along the imaginary line 140 to create a resilient force to drive the sliding portions 50 to move back towards each other when changing to the locking position, as described below.

After the electronic device 100 is disengaged from the fastener 200 or hung on the fastener 200, the resilient member 70 contracts and moves the sliding portions 50 relative to the enclosure 10 along the imaginary line 140, and simultaneously, the control portion 60 moves along the perpendicular bisector 180. That is, the securing portion 52 of the sliding portions 50 move in the guiding grooves 67, and ultimately the sliding portions 50 close towards each other under the resilient force of the resilient member 70 until the blocking portions 56 blocks the second receiving holes 144, resulting in the electronic device 100 being in the locked position.

While an embodiment of the present disclosure has been described above, it should be understood that it has been presented by way of example only and not by way of limitation. Thus the breadth and scope of the present disclosure should not be limited by the above-described embodiments, but should be defined only in accordance with the following claims and their equivalents.

What is claimed is:
1. An electronic device, comprising:
an enclosure, comprising a bottom wall defining a pair of receiving portions and a sidewall defining an accommodating hole, wherein centers of the pair of receiving portions define a imaginary line, and the accommodating hole is configured on a perpendicular bisector of the imaginary line; and
a locking assembly, comprising:
a guiding part, attached to the bottom wall, the guiding part and the bottom wall collectively defining a receiving space;
a pair of sliding portions, received in the receiving space and movable along the imaginary line, each of the pair of sliding portions comprising a securing portion, a blocking portion, and a groove adjacent to the corresponding blocking portion;
a resilient member, comprising a pair of locking ends respectively fixed to the securing portions of the pair of sliding portions; and
a control portion having one end passing through the accommodating hole and another end received in the receiving space and defining a pair of guiding grooves to respectively engage with the securing portions of the pair of sliding portions, the pair of guiding grooves symmetrical about and inclined to the perpendicular bisector; and
wherein movement of the control portion relative to the enclosure along the perpendicular bisector cause the blocking portions of the pair of sliding portions to cover or uncover the pair of receiving portions, thereby the electronic device being disposed between a locked and an unlocked position;
wherein in the unlocked position, the grooves are superposed on the receiving portion, and the resilient member is expanded to create a resilient force to drive the sliding portions to move back towards each other.

2. The electronic device as recited in claim 1, wherein each of the receiving portions defines a first receiving hole and a second receiving hole in communication with the first receiving hole, in the locked position the blocking portions cover the second receiving holes.

3. The electronic device as recited in claim 2, wherein width of each of the grooves is greater than that of the corresponding second receiving hole.

4. The electronic device as recited in claim 1, wherein the guiding part comprises a main body attached to the bottom wall and a receiving portion projecting from the main body, the receiving space is collectively defined by the receiving portion and the bottom wall.

5. The electronic device as recited in claim 4, wherein the receiving portion is substantially T-shaped.

6. The electronic device as recited in claim 1, wherein each of the securing portions defines a locking recess used to engage with one corresponding of the locking ends of the resilient member.

7. The electronic device as recited in claim 6, wherein the securing portions are columnar, each of the locking recess circles the outer surface of the securing portion.

8. The electronic device as recited in claim 7, wherein the locking ends are ring-shaped to be placed around the securing portions and positioned in the locking recesses, respectively.

9. The electronic device as recited in claim 1, wherein the control portion comprises an engaging portion, in which the pair of guiding grooves defined, a base portion and a pair of limiting portions, the base portion is connected between the engaging portion and the operating portion, and the pair of limiting portions projecting from the base portion are formed by bending two side edges of the base portion to limit the direction of movement of the base portion within the accommodating hole.

10. The electronic device as recited in claim 9, wherein the pair of guiding grooves are configured to be co-formed to have a substantially V-shaped configuration.

11. The electronic device as recited in claim 10, wherein the opening of the V-shaped configuration faces towards the base portion.

12. The electronic device as recited in claim 1, wherein each of the pair of sliding portions comprises a securing plate, on which the corresponding securing portion protrudes.

13. The electronic device as recited in claim 12, wherein the securing plates and an inner surface of the bottom wall collectively define a receiving gap, the resilient member and part of the control portion are received in the receiving gap, and the securing portions extend from the securing plates toward to the inner surface.

* * * * *